(12) United States Patent
Barrese et al.

(10) Patent No.: US 6,372,101 B1
(45) Date of Patent: Apr. 16, 2002

(54) APPARATUS FOR PREVENTING DRAG-OUT

(75) Inventors: Ralph A. Barrese, Binghamton; Allen H. Hopkins, Barton; John J. Konrad, Endicott; Donald L. Putman, Johnson City; David A. Space, Jr., Deposit, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/391,724

(22) Filed: Sep. 8, 1999

(51) Int. Cl.[7] .................... C25B 9/00; C25D 17/00; B05C 11/02
(52) U.S. Cl. .................. 204/279; 204/207; 118/122; 15/88.1
(58) Field of Search ................. 204/242, 213, 204/212, 214, 217, DIG. 6, 206, 207, 279; 118/675, 677, 56, 121, 122

(56) References Cited

U.S. PATENT DOCUMENTS

| | | | |
|---|---|---|---|
| 317,603 A | * 5/1885 | Wilson et al. | 15/88.1 X |
| 3,031,802 A | 5/1962 | Leliaert | |
| 3,776,771 A | * 12/1973 | Shepard | 118/121 X |
| 3,979,920 A | 9/1976 | Burgess et al. | |
| 4,376,684 A | * 3/1983 | Eidschun | 204/224 R X |
| 4,457,515 A | * 7/1984 | Eidschum | 277/1 |
| 5,462,649 A | * 10/1995 | Keeney et al. | 205/93 |
| 5,837,120 A | * 11/1998 | Forand et al. | 204/207 X |
| 5,865,963 A | * 2/1999 | Ebert | 204/228 |
| 6,131,235 A | * 10/2000 | Snyder | 15/308 |
| 6,168,691 B1 | * 1/2001 | Kauper et al. | 204/224 R |

FOREIGN PATENT DOCUMENTS

JP  53-65733  * 11/1976  .......... G03D/13/00

OTHER PUBLICATIONS

Lowenheim, Frederick A., *Electroplating*, Chapter 7, "Rinsing and Water", McGraw–Hill Book Company, New York, pp. 99–101, (No Date).

* cited by examiner

Primary Examiner—Donald R. Valentine
(74) Attorney, Agent, or Firm—Connolly Bove Lodge & Hutz LLP

(57) ABSTRACT

An apparatus for preventing drag-out is provided. The apparatus is arranged at an exit where a workpiece leaves a plating chamber. Brush members are arranged to contact both sides of the workpiece as it leaves the plating chamber. The brush members are adjustably arranged in a housing such that the angle of the brush member relative to the workpiece can be varied. A locking mechanism is provided to hold the brush member at a selected angle. The entire apparatus is adjustably inward and outward with respect to the workpiece as well as with respect to the plating chamber.

20 Claims, 4 Drawing Sheets

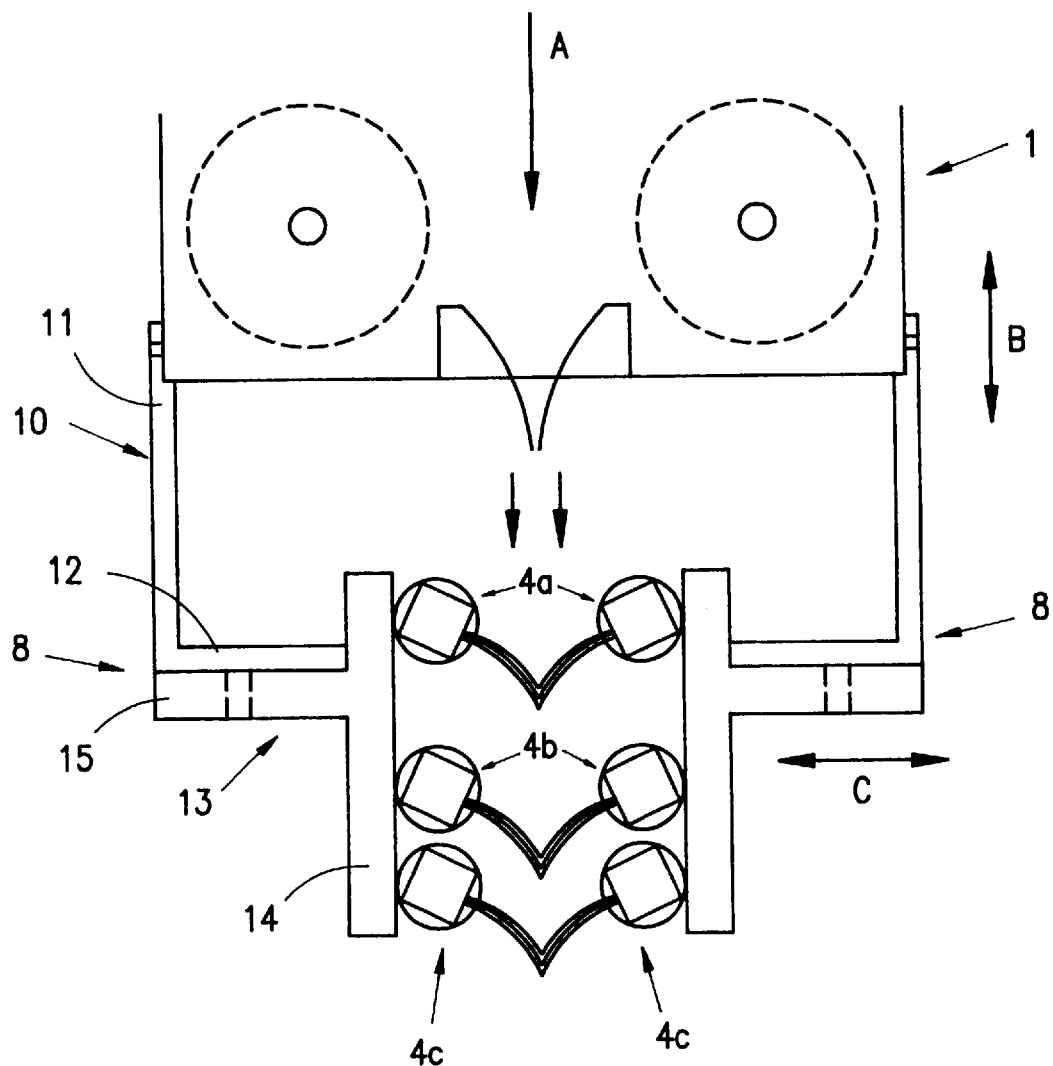
FIG_1

APPARATUS FOR PREVENTING DRAG-OUT

FIELD OF INVENTION

The present invention is directed to applications where products such as printed circuit boards are moved from station to station during a manufacturing process. In particular, the invention relates to an apparatus used during electroplating to prevent drag-out.

BACKGROUND OF THE INVENTION

In the manufacture of integrated circuit boards, the different components need to be plated with various materials. The plating is typically accomplished by electroplating. Electroplating requires that the components be transferred from one treating solution to another. The various treating solutions are contained in plating chambers. The circuit boards move from chamber to chamber in a continuous process. The treating solutions consist of various chemicals and are used to coat the workpiece with the desired materials. Each chemical bath may have a rinse bath after it and preceding the next chamber. Additionally, at the end of the electroplating process, the workpiece is usually removed from the final treating solution and rinsed in a water bath.

As the circuit board or workpiece is transferred from plating chamber to plating chamber, some of the solution in which the circuit board has been immersed adheres to the surface of the circuit board. In most instances, the adhering solution must be removed from the circuit board before it enters the next step in the process. When the boards are removed from the different plating chambers, the solution that adheres to the boards is called drag-out.

Drag-out has several detrimental effects. The solution adhering to the workpiece as it exits one plating chamber will be mixed with the treating solution in the subsequent plating chamber, potentially contaminating the solution therein. This contamination contributes to the solutions needing to be changed more frequently, increasing the cost and time involved in the process. Additionally, precious metals, such as gold, are sometimes plated onto the components of the circuit board. In order to make the electroplating process economically viable, as much of the precious metal as possible must be recovered when the panel leaves the plating solution. Moreover, if the rinse water used at the end of the plating process becomes contaminated with environmentally hazardous materials, the cost of cleaning and disposing of the rinse water substantially increases.

Therefore, there is a need for an apparatus which prevents drag-out between adjacent plating chambers. Reduced drag-out results in longer bath life from less contamination as well as an improvement in the yield of any precious metal used in the electroplating process.

SUMMARY OF INVENTION

The present invention provides an apparatus for preventing drag-out. The apparatus comprises at least one brush member which is adjustably arranged in a housing. One end of the brush member extends from the housing and contacts the workpiece as it passes. The other end of brush member is adjustable in the housing so that the angle of the brush member with respect to the workpiece or housing can be varied. Lock elements are provided to hold the brush member in its selected position.

In another embodiment, the brush members are arranged in a tubes. Each tube has a slot extending longitudinally at least along a part of its length. The tubes are rotatably arranged in the housing. The brush members extend through the slot with a first end of the brush arranged in the tube and a second end contacting the workpiece.

In a further embodiment of the present invention, the housing is attached to the plating chamber. Whether that chamber processes workpieces horizontally through any angle up to a vertical position, the housing containing the brush members is adjustable such that the brush members may be moved closer or farther from the plating chamber in a first direction, as well as in a second direction closer to or farther from the workpiece.

BRIEF DESCRIPTION OF THE DRAWINGS

The present invention will now be further described in the following pages of the specification when taken in conjunction with the attached drawings, in which:

FIG. 1 is a partial cross-section from a top view;

DETAILED DESCRIPTION OF THE INVENTION

Figure 3:
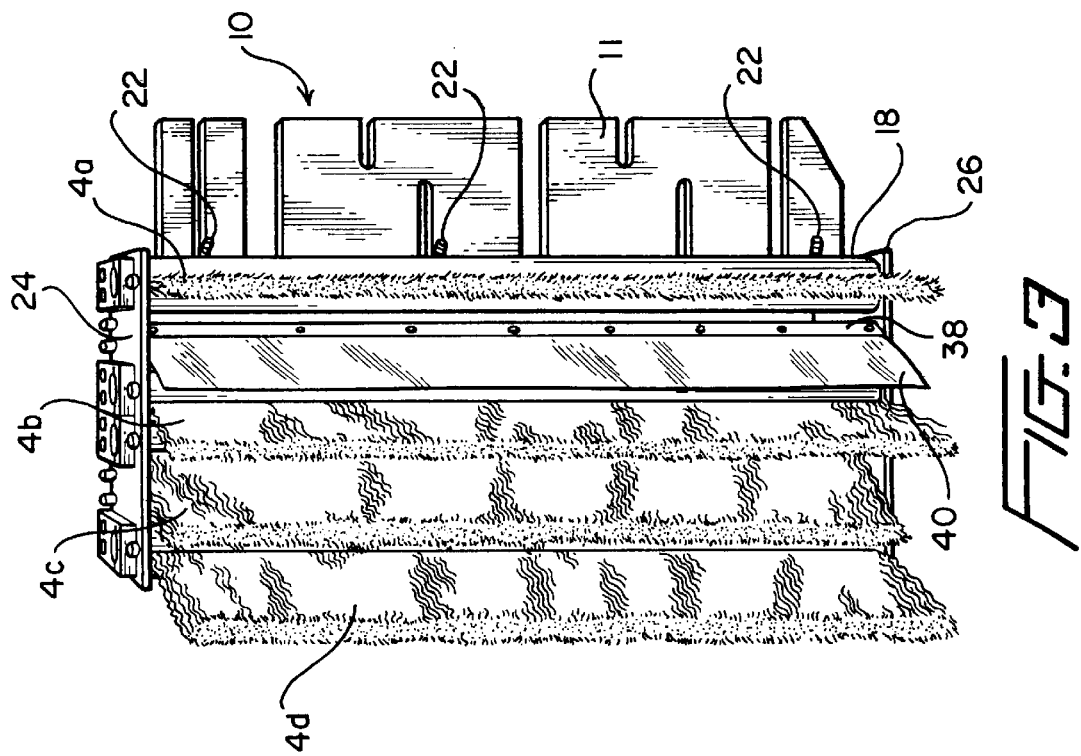
FIG. 3 is a frontal view similar to FIG. 1.

The present invention provides an apparatus for preventing drag-out from a plating cell or other flooded chamber. The present invention is preferably implemented in the context of conventional electroplating devices in which a workpiece is transferred between process chambers containing treating solutions. The apparatus should be arranged where the workpiece exits the process chamber to reduce drag-out. This background of electroplating is well known to one skilled in the art.

FIG. 1 shows an embodiment of the present invention connected to a plating chamber. The brush members 4 are mounted in a housing 8. The housing 8 is attached adjacent to an exit from the plating chamber 1 where the workpiece is transferred from one plating chamber to another. Two sets of brush members 4 are preferably provided in separate housings 8 to contact the workpiece on opposite sides. The brush members 4 are preferably oriented in the direction of solution flow. The workpiece travels through the plating chamber in the direction indicated by arrow A. As the workpiece exits the plating chamber, it passes between the two sets of brush members 4. The individual brush members 4a–4c contact the workpiece and wipe away any treating solution still adhering to the workpiece and prevent any treating solution from streaming out along the workpiece. In this way, the treating solution is kept from entering the next plating chamber or rinse in the process. The brush members 4 essentially stop the flow of the treating solution into adjacent areas where only a portion of the treating solution is reclaimed. Any treating solution wiped away from the workpiece may then be returned to the plating chamber in a known manner.

As shown in FIGS. 1–5, at least one brush member is provided in housing 8. To obtain maximum efficiency, several brush members are preferably arranged in series in the housing. The number of brushes is selected depending on the particular application. Additionally, the space between the brush members arranged in series may be varied to allow additional elements, such as squeegees, to be included in the housing. Further, as mentioned above, the brush members are adjustably arranged in their respective housings so that the angle of a brush member relative to the workpiece may be varied. If several brush members are provided in series, it is desirable that each brush member be adjustable individually. A locking system should be provided to hold each brush member at its selected angle. In this manner, the present invention becomes infinitely adjustable in terms of workpiece contact pressure. The contact pressure may be varied by, for example, changing the number of brushes, changing the angle of the brushes relative to the workpiece, arranging the brushes directly opposite or offset from each other, and varying the length of the brushes.

The angle of the brush members 4 relative to the workpiece and the housing 8 can be adjusted to vary the amount of contact between the brush members 4 and the workpiece. As shown in FIG. 1, brush members 4 are preferably arranged on both sides of the workpiece and several brush members 4a, 4b, 4c are arranged in series in each housing 8. The angle of the brush members 4 may be selected individually, independent of each other. Also, the brush members 4 may be offset from the corresponding brush members 4 in the housing on the opposite side of the workpiece. This may be done, for example, by adjusting the position of the housing 8 as described below. The brush members 4 are shown in the figure arranged in a vertical direction with respect to the plating chamber. However, the brush members 4 may be provided in different orientations depending on the application. Of course, the housing would need to be modified accordingly.

Figure 5:
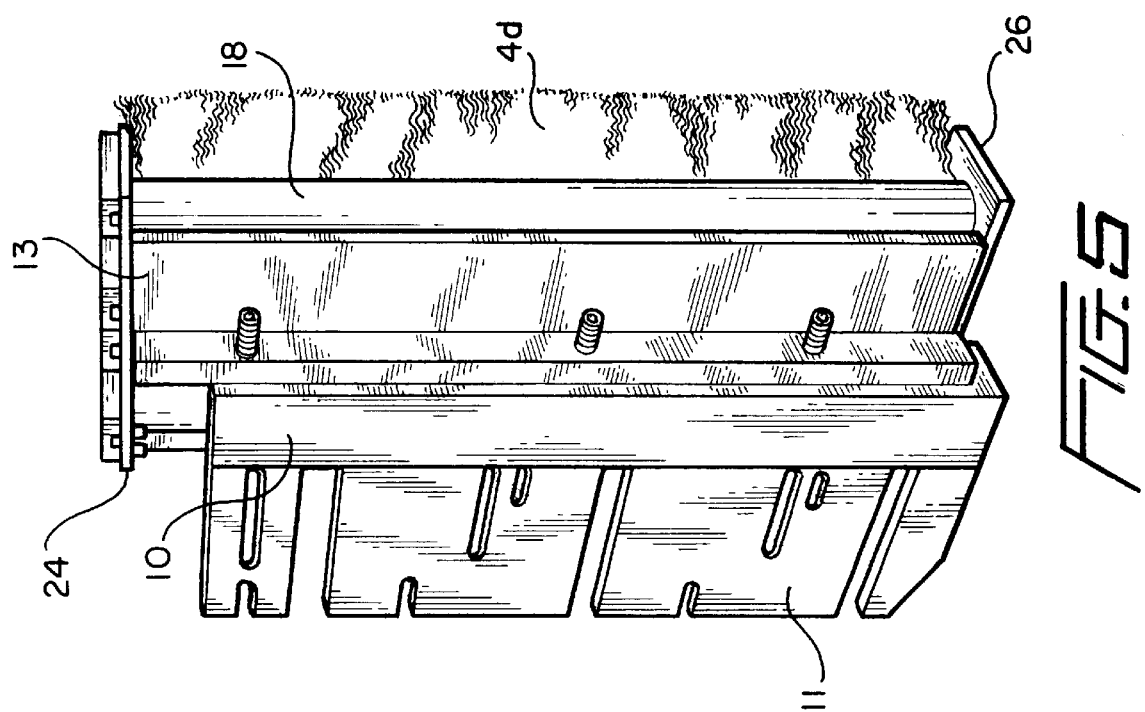
FIG. 5 is a back view of the apparatus.

As mentioned above, housing 8 is preferably adjustable so that the brush member's 4 position may be changed closer to or farther from the plating chamber, as well as closer to or farther from the workpiece as it exits the process chamber. In the embodiments shown in the figures, the housing 8 comprises an L-shaped piece 10 and a T-shaped piece 13. The L-shaped piece 10 is attached to the plating cell 1 at a first one of its legs 11. This leg 11 may be slotted as shown in FIG. 5 so that the position of the housing 8 on the plating cell 1 can be varied. The housing 8 is attached to the plating cell by a fastener, such as a screw. The fastener is inserted through the slots, the housing 8 may be slid into the desired position and secured to the plating cell 1. This allows the position of the housing 8 to vary relative to the plating chamber in direction B.

A second leg 12 of L-shaped piece 10 is connected to T-shaped piece 13. An extension 14 of the T-shaped piece 13 supports the brush assemblies 4. A second extension 15 is attached to the L-shaped piece 10. The second extension 15 of the T-shaped piece may also be slotted so that it can be attached to the L-shaped piece 18 at various positions. The slots on the T-shaped pieces 13 allow the brush assemblies 14 to be moved in direction C shown in FIG. 1. These adjustable features of the housing allow the brush members 4 to be placed in many various positions relative to the plating chamber 1 and the workpiece, depending on the circumstances.

Figure 2:
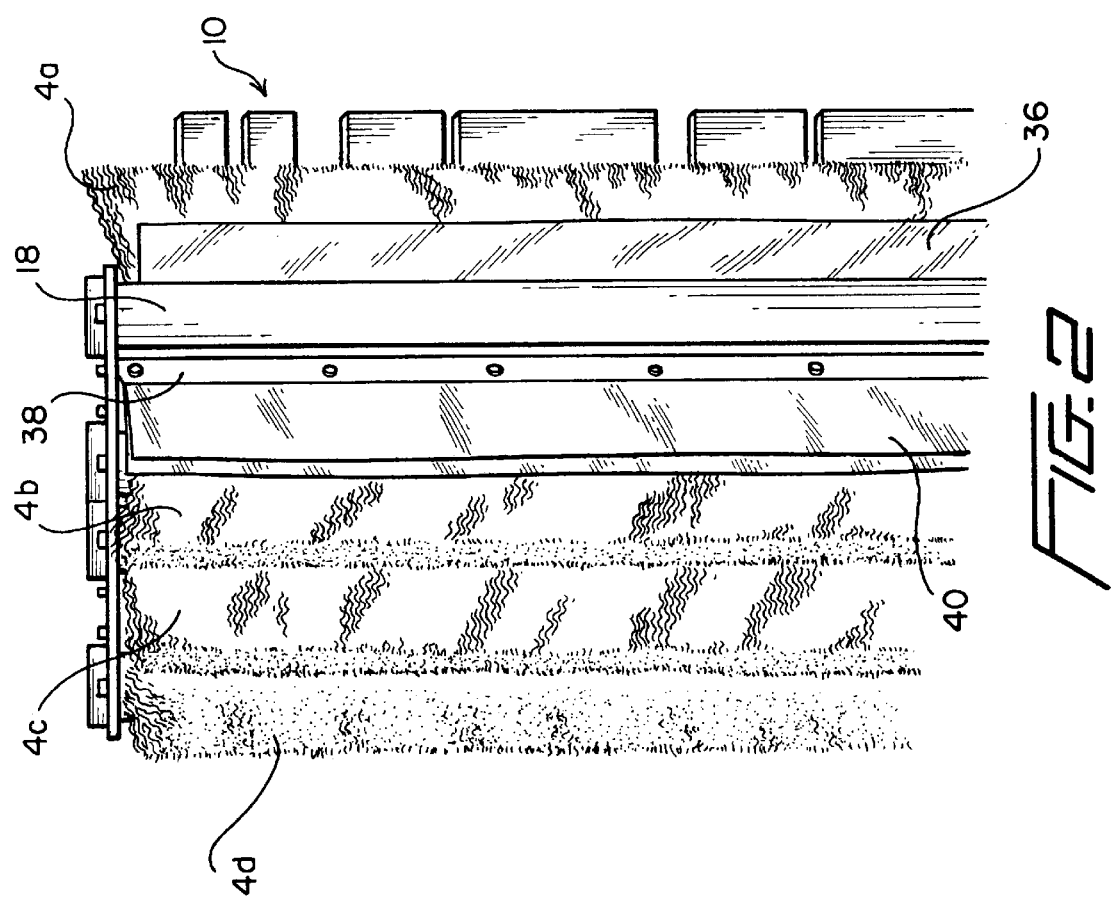
FIG. 2 is a front view showing four brush assemblies in their tubes.
Figure 6:
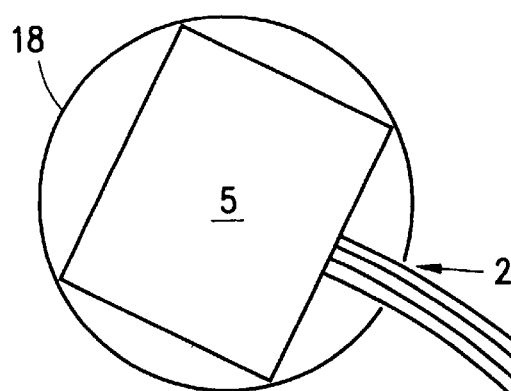
FIG. 6 is a cross-section of a tube and brush member.

In the embodiment shown in FIG. 2, the brushes are held in the housing by tubes 18. A detail of this arrangement is shown in FIG. 6. The tube 18 may be made from CPVC pipe or other suitable material with a slot 20 cut therein. The slot 20 should extend longitudinally along at least a part of the length of the tube 18. The brush member 4 includes a base 5 and bristles 6. The base 5 is shown arranged inside the tube 18 with the bristles 6 extending from the base 5 through the slot 20 of the tube 18. The brush member 4 is held in the tube 18 by an interference fit between the bristles 6 and the slot 20. The width of the slot should be chosen with regard to the thickness of the bristles 6 for a secure fit. The length the bristles 6 extend from the tube 18 can be varied to change the contact pressure of the brush member 4 against the workpiece. To help stabilize the brush member in the tube, the base 5 is preferably dimensioned so that it is held in the tube 18 by an interference fit. However, during operation, some movement of the brush member 4 within the tube 18, may still occur. Therefore, fasteners may be provided to limit movement of the base in the tube. As shown in FIG. 3, set screws 22 pass through the tube 18 and contact the base therein to limit the movement of the brush member 4 in the tube 18.

The tubes 18 are supported in the housing 8 by upper 24 and lower 26 brackets. The tubes 18 should be rotatably arranged in the brackets 24, 26 and rest upon, for example, pilots. The angle of the brush members 4 can then be varied by rotating the tubes 18 relative to the brackets 24, 26. This allows the brush members 4 to intermesh with oppositely arranged brush members. By changing the angle of the brush members, the amount of intermeshing is varied. The brush members can be arranged substantially tip-to-tip with brush members in the opposite housing or at a 90° angle relative to the housing. Depending on the circumstances, such as the amount of material adhering to the surface of the workpiece or the amount of streaming of solution along the workpiece, the angle of the brushes will vary. FIGS. 2 and 3 show the brush members 4a, 4b, 4c, and 4d arranged at different angles.

Figure 4:
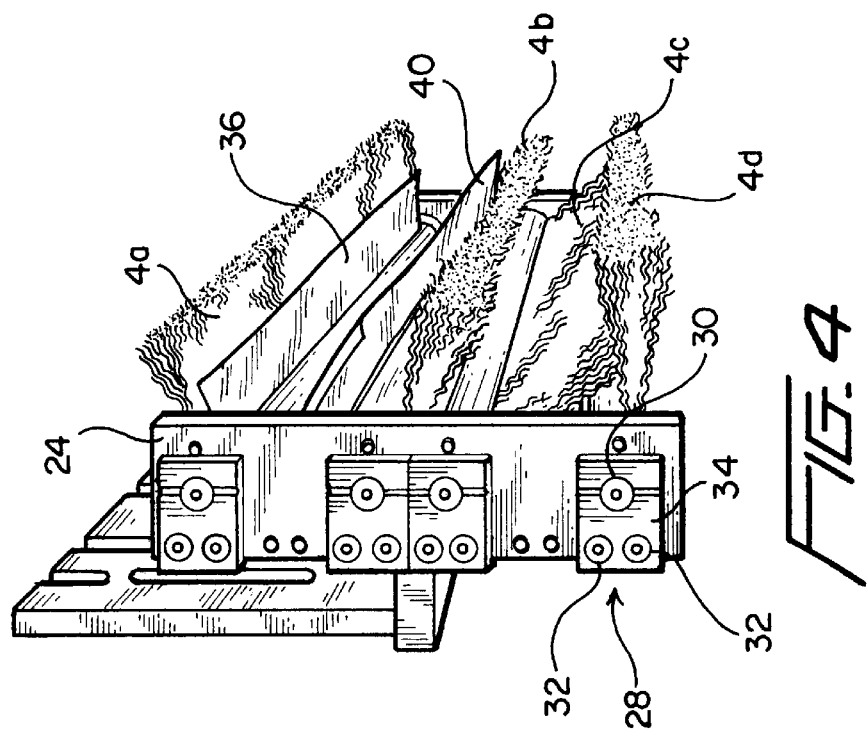
FIG. 4 is a top view of the embodiment of FIG. 1 showing the locking mechanism.
Figure 7:
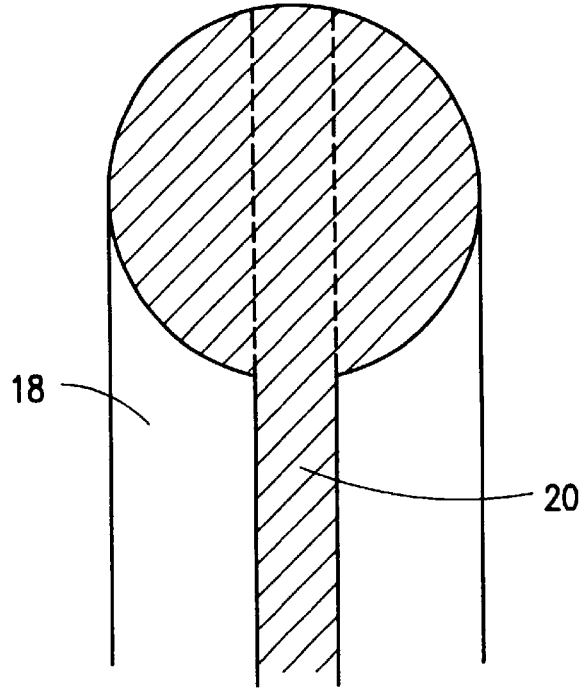
FIG. 7 is a detail of the lock.

A locking system 28 may be provided to hold the brush members 4 at their selected angles. The locking system may include a set screw 30 and angled screws 32 as shown in FIG. 4. Here, the locking mechanism includes a block 34 arranged on the top bracket 24. The set screw extends through the block 34 and into the top bracket. The set screw 30 is loosened to permit the tube 18 to be rotated. After the brush member 4 has been moved to its desired position, the set screw 30 is then tightened. The block 34 then bears down on the pilot preventing the tube 18 from rotating and holds the brush member 4 in the selected position. Additionally, the pilot 40 may be provided with a stud 42, as shown in FIG. 7. The stud 42 extends from the pilot 40 into the slot 20 in the tube 18. The stud will rotate with the tube and pilot when the set screw is loosened. When the set screw is tightened preventing the pilot from moving, the stud also becomes immobile and provides additional securing forces preventing the tube from moving. Additional locking support may be obtained by using the angled screws 32.

Turning now to FIG. 2, a backer 36 may be provided to maintain the angle as well as the shape of the bristles. The backer 36 is preferably arranged immediately behind the brush member 4 relative to the direction of travel of the workpiece. The backer 36 should extend along the entire length of the brush member 4 in a vertical direction and at least along a part of the length of the bristles 6 of the brush in a horizontal direction. The backer 36 may be a squeegee or simply a relatively stiff piece of plastic inserted into the slot 20 of the tube 18. Providing the brush members 4 with a backer 36 also contributes to workpiece guidance through the plating chamber. Additionally, by providing some brush members 4 with backers 36 and others without, the contact pressure between the brush members 4 and the workpiece through the apparatus may be varied.

Occasionally, control of the treating solution flow in addition to that provided by the brush members is necessary.

Therefore, the present invention may also include mounting strips 38 which allow installation of additional squeegees. A mounting strip 38 and a squeegee 40 are shown in FIG. 2. As mentioned above, the distance between the brush members arranged in series can vary. Here, brush member 4a is spaced apart from brush member 4b. Brush members 4b and 4c are adjacent each other. The space provided between brush members 4a and 4b allows a mounting strip to be included in the housing. The mounting strip 38 may be a plastic strip arranged in the housing. The mounting strip 38 should run in the same direction as the tubes 18 and hold the base of the squeegee 40 in place. The placement of the mounting strips and tubes in the housing can be selected as desired.

Accordingly, an apparatus for preventing drag-out is provided and the flow of a treating solution from a plating chamber is minimized. The apparatus is adjustable in terms of workpiece contact pressure by changing different features. For example, changing the number of brush/backer assemblies, varying the angles of the brushes, offsetting brushes arranged in series, providing additional squeegees and varying the length of the bristles can change the contact pressure on the workpiece. Additionally, the entire assembly may be adjustable innards against the workpiece for more control of the treating solution flow. The assembly may also be adjustable closer and farther from the plating chamber which can be used to maximize its effectiveness.

While a preferred embodiment of the invention has been described above, since variations in the invention will be apparent to those skilled in the art, the invention should not be construed as limited to the specific embodiment described above.

What is claimed is:

1. An apparatus for preventing drag-out comprising:
    a brush member having a first end adjustably arranged in a housing and a second end extending from the housing, wherein an angle of the brush member with respect to the housing can be varied;
    a lock element holding the brush member at a selected angle; and
    a tube arranged in the housing and having a slot extending longitudinally along at least a part of its length, the brush member extending through the slot with the first end of the brush member being arranged in the tube.

2. The apparatus of claim 1, further comprising a backer attached at the first end of the brush member and extending towards the second end, the backer supporting the brush member along at least a part of its length.

3. The apparatus of claim 1, further comprising a squeegee element arranged in the housing.

4. The apparatus of claim 1, further comprising mounting strips arranged in the housing for supporting the squeegee.

5. The apparatus of claim 1, wherein the tube is rotatably arranged in the housing thereby all allowing the angle of the brush member to be varied.

6. The apparatus of claim 5, wherein the tube is arranged vertically in the housing.

7. The apparatus of claim 5, further comprising fasteners extending into the tube and holding the first end of the brush member in place.

8. The apparatus of claim 1, wherein the lock element comprises a set screw having a first position in which the tube can be rotated and a second position in which the tube is held in place.

9. The apparatus of claim 8, wherein the lock element further comprises an angled screw.

10. The apparatus of claim 8, wherein the housing is adjustable towards and away from a process chamber.

11. The apparatus of claim 8, wherein the brush member is moveable.

12. In a plating device in which a workpiece is transferred from a process chamber containing a liquid solution, an apparatus for reducing drag-out comprising:
    brush members adapted to be arranged in respective housings on opposite sides of the workpiece as it moves from the process chamber, wherein at least one of the housings is moveable towards and away from the other housing; and
    tubes, each tube having a slot along at least a part of its length, each brush member being arranged in a corresponding tube with bristles extending out through the tube slot, the tubes being rotatably arranged in the housings wherein the positions of the brush members can be varied.

13. The apparatus of claim 12, wherein each housing comprises an L-shaped member having first and second legs, the first leg having slots and being attached to each housing.

14. The apparatus of claim 13, wherein each housing further comprises a T-shaped member attached to the second leg of the L-shaped member such that two ends of the T are perpendicular to the second leg.

15. The apparatus of claim 12, wherein each housing comprises upper and lower brackets supporting the tubes.

16. An apparatus for preventing dragout comprising:
    a housing having first and second brackets;
    tubes having slots along at least a part of their length, the tubes extending between the first and second supports and being rotatably arranged in the housing;
    brushes provided in the tubes, the brushes having bristles extending from the slots, wherein the positions of the brushes can be varied with respect to the housing by rotating the tubes; and
    locks provided on at least one of the brackets, the locks holding the tubes in place when the tubes are moved to their desired positions.

17. The apparatus of claim 16 wherein the locks comprise:
    a block arranged on the bracket above each tube and a fastener extending through the block into the bracket, the fastener being moveable between a locked and an unlocked position, in the locked position the fastener bears the block onto the tube preventing its movement and in the unlocked position the tube is moveable.

18. The apparatus of claim 17 wherein the locks further comprise angled screws.

19. The apparatus of claim 17 further comprising pilots provided in the first and second supports, the tubes being arranged in the pilots wherein rotation of the tubes is possible.

20. The apparatus of claim 19 further comprising a stud extending from each of the pilots into the slot of its corresponding tube, each stud preventing rotation of its corresponding tube when the fastener is in the locked position.

* * * * *